(12) United States Patent
Kim et al.

(10) Patent No.: US 6,399,476 B2
(45) Date of Patent: *Jun. 4, 2002

(54) MULTILAYER PASSIVATION PROCESS FOR FORMING AIR GAPS WITHIN A DIELECTRIC BETWEEN INTERCONNECTIONS

(75) Inventors: Jin Yang Kim; Si-Woo Lee; Won Seong Lee, all of Seoul; Sang-Pil Sim, Suwon, all of (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/432,101
(22) Filed: Nov. 2, 1999

(30) Foreign Application Priority Data

Feb. 13, 1999 (KR) .............................................. 99-05231

(51) Int. Cl.[7] ...................... H01C 21/4763; H01C 21/31
(52) U.S. Cl. ........................ 438/619; 438/624; 438/668; 438/780; 438/787
(58) Field of Search ................................. 438/624, 619, 438/622, 623, 668, 669, 780, 787, 791, 958, 421–422

(56) References Cited

U.S. PATENT DOCUMENTS

| | | | |
|---|---|---|---|
| 5,641,712 A | * 6/1997 | Grivna et al. | 438/624 |
| 5,668,398 A | 9/1997 | Havemann et al. | 257/522 |
| 5,716,888 A | 2/1998 | Lur et al. | 438/619 |
| 5,759,913 A | 6/1998 | Fulford, Jr. et al. | 438/624 |
| 5,851,603 A | * 12/1998 | Tsai et al. | 427/579 |
| 6,159,845 A | * 12/2000 | Yew et al. | 438/637 |

OTHER PUBLICATIONS

Wolf, "Silicon Processing For The VLSI Era", Lattice Press, 1990, pp. 273–275.*

* cited by examiner

*Primary Examiner*—Ha Tran Nguyen
(74) *Attorney, Agent, or Firm*—Volentine Francos, PLLC

(57) ABSTRACT

A process for forming air gaps within an interlayer dielectric is provided to reduce loading capacitance between interconnections. A first dielectric layer is deposited on the spaced interconnections. This first dielectric layer is deposited more thickly at the top sides than at the bottom sides of the interconnections. A second dielectric layer is deposited on the first dielectric layer to a controlled thickness that causes formation of air gaps therewithin between the interconnections. The poor step coverage of the first dielectric layer makes it easier to form the air gaps. Air gaps between interconnections allows reduced permittivity of the overall dielectric structures and thereby reduces the interconnect line to line capacitance, and increases the possible operation speed of the semiconductor device.

11 Claims, 3 Drawing Sheets

MULTILAYER PASSIVATION PROCESS FOR FORMING AIR GAPS WITHIN A DIELECTRIC BETWEEN INTERCONNECTIONS

BACKGROUND OF THE INVENTION

1. Field of the Invention

The present invention relates generally to the fabrication of a semiconductor device, and more particularly to a multilayer dielectric process for forming air gaps therein for reducing permittivity of the dielectric between interconnections.

2. Description of the Related Art

Generally speaking, semiconductor devices are formed by alternating an insulating layer and a conductor in a predetermined manner over a silicon semiconductor substrate. The conductor separated by the insulating layer is electrically connected to overlying and underlying another conductors through openings (contact hole or via) in the insulating layers. Such conductors may include impurity diffusion region and metal line made of Al (aluminium), Ti (titanium), Ta (tantalum), W (tungsten), polycrystalline silicon, or a combination thereof.

Interconnection lines (or conductors) are fashioned on the semiconductor device structure and spaced by a dielectric above an underlying conductor or substrate by a dielectric thickness. Each conductor is spaced a distance from other conductors by a dielectric within the same level of conductors. Accordingly, conductor-to-conductor capacitance (i.e., coupling capacitance) is generated. As circuit density increases, spacing between conductors decreases and thus coupling capacitance therebetween increases.

Increases in coupling capacitance between conductors eventually results in an increase in RC delay, which is an important characteristic of an integrated circuit since it limits the speed (frequency) at which the circuit or circuits can operate. The shorter the RC delay, the higher the speed of the circuit or circuits. It is therefore important that RC delay should be minimized as much as possible.

The capacitance between conductors is highly dependent on the insulator, or dielectric, used to separate them. Therefore it is required to reduce the permittivity of a dielectric material between conductors. As such, it would be desirable to employ a fabrication technique in which dielectrics between conductors achieve low permittivity. The lowest possible, or ideal, dielectric constant is 1.0, which is the dielectric constant of a vacuum, whereas air has a dielectric constant of less than 1.001.

Therefore, it is desired to form a passivation layer with low permittivity while concurrently forming air gaps therein between the conductors to reduce the coupling capacitance.

SUMMARY OF THE INVENTION

The present invention was made in view of the above problem, and the present invention is directed toward providing a multilayer dielectric process for forming air gaps within the dielectric between the interconnections for a low permittivity dielectric. The present invention uses multilayer dielectric to purposely form air gaps within the dielectric. The permittivity of air within the dielectric material is less than that of the surrounding dielectric material which allows an overall decrease in permittivity between interconnections and a corresponding increase in operation speed.

The air gaps are formed by the multilayer dielectric process. More specifically, a first dielectric layer such as PE-CVD (plasma enhanced chemical vapor deposition) oxide layer using TEOS (tetraethyl orthosilicate) source is deposited on the patterned spaced metal interconnections. The PE-CVD TEOS oxide layer is deposited to provide a poor step coverage over the interconnections, i.e., deposited relatively thickly at top sides and deposited relatively thinly at bottom sides of the patterned metal interconnections. This poor step coverage of first dielectric makes it easier to form the air gaps in subsequent second dielectric and serves to increase volume of the air gaps. The second dielectric layer is deposited over the first dielectric in such controlled manner that causes air gaps within the second dielectric. The thickness of the second dielectric is large enough to cause the formation of the air gaps therein and the air gaps are completely covered by the dielectric. This second dielectric layer preferably includes a low permittivity dielectric such as a silicon oxynitride(SiON) layer. This low permittivity advantageously reduces coupling capacitance between the patterned spaced metal lines and overlying other conductors.

Briefly, in accordance with one aspect of the present invention, there is provided a method for forming air gaps in the dielectrics between the interconnections. The method includes providing at least a pair of spaced interconnects over a semiconductor topology. The semiconductor topology includes an interlayer insulating layer at a top thereof. The method further includes depositing a first dielectric layer on the spaced interconnects and over the semiconductor substrate. The first dielectric layer is deposited relatively more thickly at top sides of the interconnects than at bottom sides of the interconnects. The first dielectric layer is made of an TEOS oxide layer by a PE-CVD technique. The method further includes depositing a second dielectric layer over the first dielectric layer to cause the formation of an air gap in the second dielectric layer and between the spaced interconnects. The second dielectric layer can be made of silicon oxynitride. Alternatively, the second dielectric layer may be made of silicon nitride (SiN). The method further includes depositing a third dielectric layer on the second dielectric layer.

According to another aspect of above mentioned-method, the method further includes depositing a silicon nitride layer over the first dielectric layer, wherein the second dielectric layer is deposited thereover to cause the formation of the air gap.

In accordance with another aspect of the present invention, there is provided a method for forming air gaps in the dielectrics between the interconnects. The method includes forming first metal patterns over a semiconductor substrate. The method further includes forming an intermetal oxide layer over the first metal patterns to a thickness of about 0.8 microns. The method further includes forming second spaced apart metal patterns over the intermetal oxide layer. The second spaced apart metal patterns are separated from each other by about 0.8 microns to 0.9 microns and have a height of about 0.15 microns. The method further includes depositing a first passivation layer of an oxide on the second metal pattern to a thickness of about 0.15 microns. The first passivation layer of an oxide is deposited thickly at a top side of the second metal pattern and is deposited thinly at a bottom side of the second metal pattern. The method further includes depositing a second passivation layer of silicon oxynitride to a thickness of about 1.2 microns, causing the formation of an air gap therein between the second metal patterns. Preferably, the air gap has a size of about 0.46 microns. The method further includes depositing a third passivation layer of a polyimide to a thickness of about 10 microns over the second passivation layer of silicon oxynitride.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

The preferred embodiment of the present invention will now be described with reference to the accompanying drawings. The present invention relates to a method for forming air gaps in an insulating layer between the interconnections with the use of multilayer dielectric. The air gaps in the dielectric between interconnections (or conductors) reduces the coupling capacitance.

Figure 1:
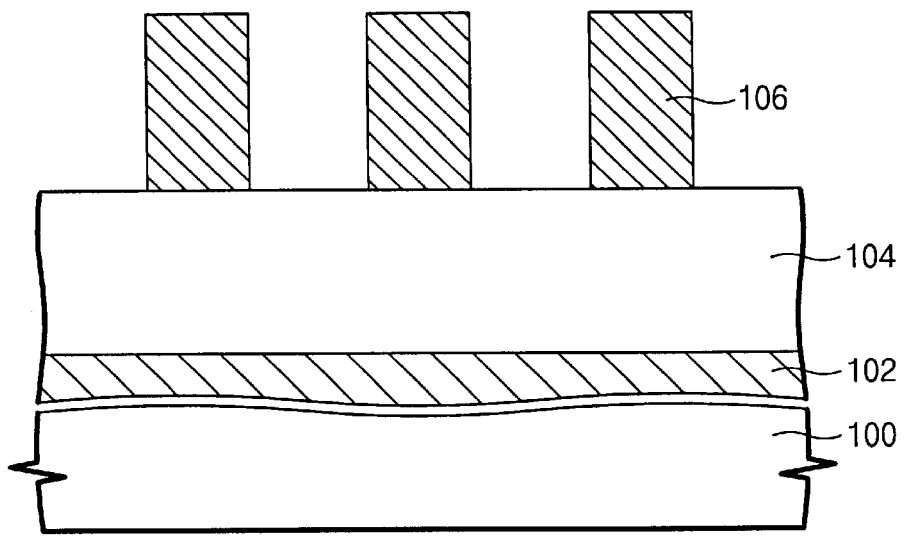
FIG. 1 is a partial cross-sectional view of an integrated circuit topography having an insulating layer and patterned metal interconnection structures according to the present invention.
Figure 2:
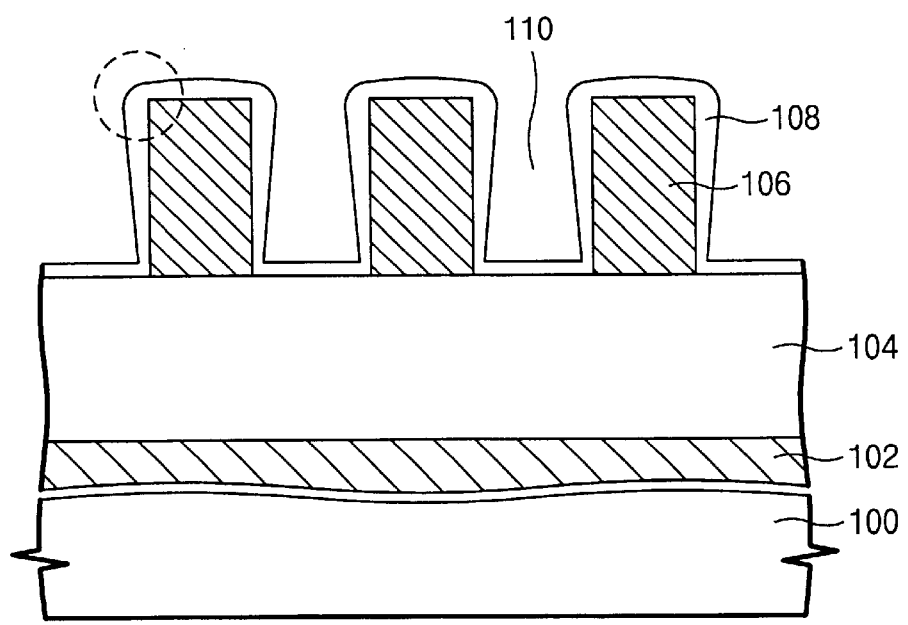
FIG. 2 illustrates a process step subsequent to that shown in FIG. 1 wherein a first passivation layer is deposited over the patterned metal interconnection structure.
Figure 3:
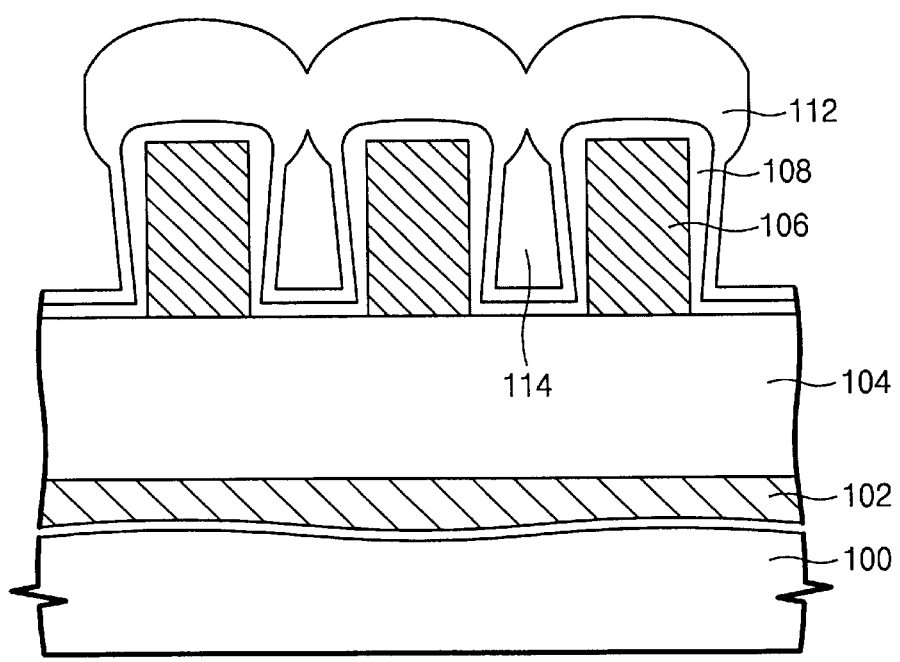
FIG. 3 illustrates a process step subsequent to that shown in FIG. 2 wherein a second passivation layer is deposited over the first insulating layer and air gaps are formed therein.

FIG. 1 schematically shows a cross-sectional view of an integrated circuit topology having an insulating layer 104 and patterned spaced conductors 106. The conductors 106 can be any spaced conductive pattern, for example, can be metal interconnections. The height of the conductors 106 is about 1 microns to 1.2 microns and the distance between the conductors 106 can be about 0.8 microns to 0.9 microns. The ratio of pattern distance and pattern height can be about 0.8~0.9: 1.0~1.2. A first layer 108 of the multilayer dielectric is formed over the integrated circuit topology. This first layer is preferably selected as a material which has a poor step coverage. For example a PE-CVD (plasma enhanced chemical vapor deposition) oxide layer using TEOS, i.e., tetraethylorthosilicate $[Si(OC_2H_5)_4]$, as a source gas may be selected to provide purposely poor step coverage as shown in FIG. 2. The PE-TEOS layer 108 can be deposited to a thickness of about 0.15 microns. The deposition of this PE-TEOS layer 108 is carefully controlled such that the PE-TEOS layer 108 is deposited thickly at the top portion, especially the top sides (see dotted circle portion in FIG. 2) of the conductors 106 and deposited thinly at the bottom sides of the conductors 102. A void 110 is formed between the conductors 106 which has a relatively narrow opening size as compared to the size of its bottom. Such a void profile makes it easier to form desired air gaps, having a low dielectric permittivity of 1.001, between the conductors 106. Furthermore, the thin PE-TEOS layer 108 on the bottom sides of the conductors 106 serves to increase the volume of the air gaps. Next, a second layer 112 of the multilayer dielectric is deposited to form the air gaps 114 therein between the conductors as shown in FIG. 3. The second layer 112 of the multilayer dielectric is preferably selected from an insulating layer exhibiting a relatively low dielectric constant, such as a silicon oxynitride layer (SiON) and is deposited to a thickness more than 1 microns, preferably 1.2 microns, so as to form the air gaps 114. The dielectric constant of the SiON is about 3.5. The air gaps 114 are initiated during the deposition of the thin first dielectric 108 and completed during the deposition of the thick second dielectric 112. The air gaps preferably each have a diameter of about 0.46 microns.

Alternatively a silicon nitride layer (SiN) can be used instead of the silicon oxynitride layer. Furthermore, a silicon nitride layer and a silicon oxynitride layer may be sequentially deposited over the PE-TEOS layer 108 with a thickness of about 0.6 microns and 1.0 microns, respectively. The presence of the air gaps 114 in the dielectric 112 between the conductors reduces the coupling capacitance and thereby reduce RC delay and accelerates device operation speed.

The method for forming air gaps in the dielectric between conductors can be preferably employed in the process of passivation for metal interconnections. The passivation process for metal interconnections will now be described with reference to FIGS. 1 to 4. For simplifying the drawing and discussion, FIGS. 1 to 3 will be cited again to this embodiment. The formation of the device isolation layer, transistors, bit line, capacitors, and other device elements which are not directively related to the formation of the air gaps are not shown and their explanation is omitted.

Referring again to FIG. 1, an intermetal dielectric layer 104 is formed over a semiconductor substrate. The intermetal dielectric layer 104 may be a PE-CVD oxide layer, using TEOS source, or a FOX layer using inorganic spin-on-glass technique, and has a thickness more than 0.8 microns. A first metal interconnection 102 has been formed by the conventional method below the intermetal dielectric layer 104. A second layer of metal is deposited over the intermetal dielectric layer 104 by a conventional sputtering method. A photoresist layer (not shown) is spin coated over the second metal layer and patterned into desired configuration. The second metal layer is then anisotropically dry etched to form second spaced metal interconnections 106 using the patterned photoresist layer. The second metal is preferably made of aluminum and has a thickness of about 0.8 microns to 1.0 microns. A capping layer (not shown) such as Ti/TiN is formed between the intermetal dielectric layer 104 and the aluminium layer 106, and on the aluminum layer 106. The overall thickness of the second metal interconnection is about 1 microns to 1.2 microns and the distance between the interconnections is about 0.8 microns to 0.9 microns. The patterned photoresist layer is then removed through conventional process such as $O_2$ plasma ashing and a subsequent stripping process.

Referring again to FIG. 2, a first passivation layer 108 is deposited over the second metal interconnections 106. This first passivation layer 108 serves to prevent the reaction between the metal interconnections and subsequent second passivation layer 112. The first passivation layer 108 is preferably made of a PE-CVD oxide layer using a TEOS source gas and deposited to a thickness of about 0.15 microns. Alternatively, another PECVD oxide layer may be used, such as a silane($SiH_4$) based oxide layer. Specifically, the PE-CVD silane based oxide layer is formed by using $SiH_4$ of about 115 sccm and $N_2O$ of about 1,700 sccm at a pressure of about 2.2 torr, and at a temperature about 400° C. for about 10 seconds. This PE-CVD oxide layer exhibits such a poor step coverage that it is deposited thickly at the top portion, specifically top sides of the second metal interconnections, while being deposited very thin at the bottom sides thereof. This poor step coverage allows easier formation of a void 110 between interconnections 106 which has a relatively narrow opening size as compared to the bottom size. This void 110 profile makes it easier to form air gaps in subsequent process.

Referring again to FIG. 3, the second passivation layer 112 is deposited over the first passivation layer 104 to a thickness condition that forms air gaps 114 therein. To form the air gaps 114, the thickness of the second passivation layer 112 is large enough, at least 1 microns, preferably more than 1.2 microns. The second passivation layer is made of a silicon oxynitride layer. This silicon oxynitride layer is formed by CVD (chemical vapor deposition) using about 280 sccm $SiH_4$, about 8,000 sccm $N_2$, about 300 sccm $NH_3$, and about 300 sccm $N_2O$ at a pressure of about 2.6 torr, at a temperature about 390° C. for about 8 to 9 minutes. Those skilled in the art will readily be able to vary these parameters to suit their circumstances. Thus formed air gaps 114 each have a diameter of about 0.46 microns. Preferably a silicon oxynitride layer with dielectric constant about 3.5 is used. Alternatively, a silicon nitride layer may be used instead, and the combination of silicon oxynitride and silicon nitride is also possible. This silicon nitride layer is formed by the CVD (chemical vapor deposition) method using about 400 sccm $SiH_4$, about 2,300 sccm $N_2$, and about 1,700 sccm $NH_3$ at a pressure of about 2.4 torr, and at a temperature of about 390° C. for about 30 to 40 seconds.

Figure 4:
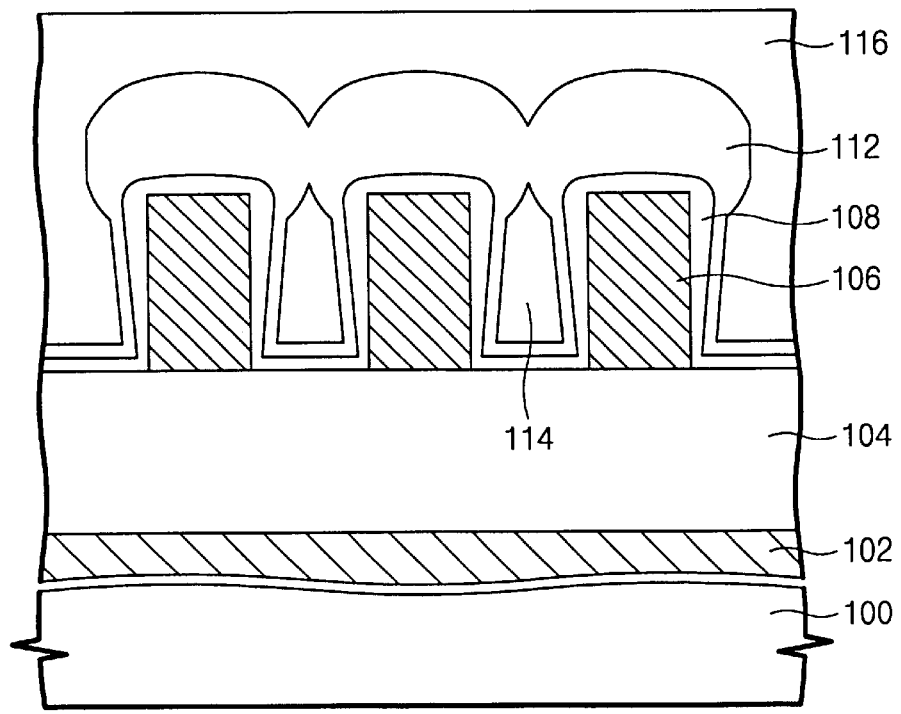
FIG. 4 illustrates a process step subsequent to that shown in FIG. 3 wherein a third passivation layer is deposited over the second insulating layer.

Referring to FIG. 4, a third conventional passivation layer 116, such as a polyimide layer, is deposited over the resulting structure to a thickness of about 10 microns. The third passivation layer 116 is then planarized and a conventional photography process is conducted and a metal contact pad (not shown) is formed in the third passivation layer 116 to the selected second metal interconnections. Subsequently, a process for forming other metal interconnections is further carried out.

Figure 5:
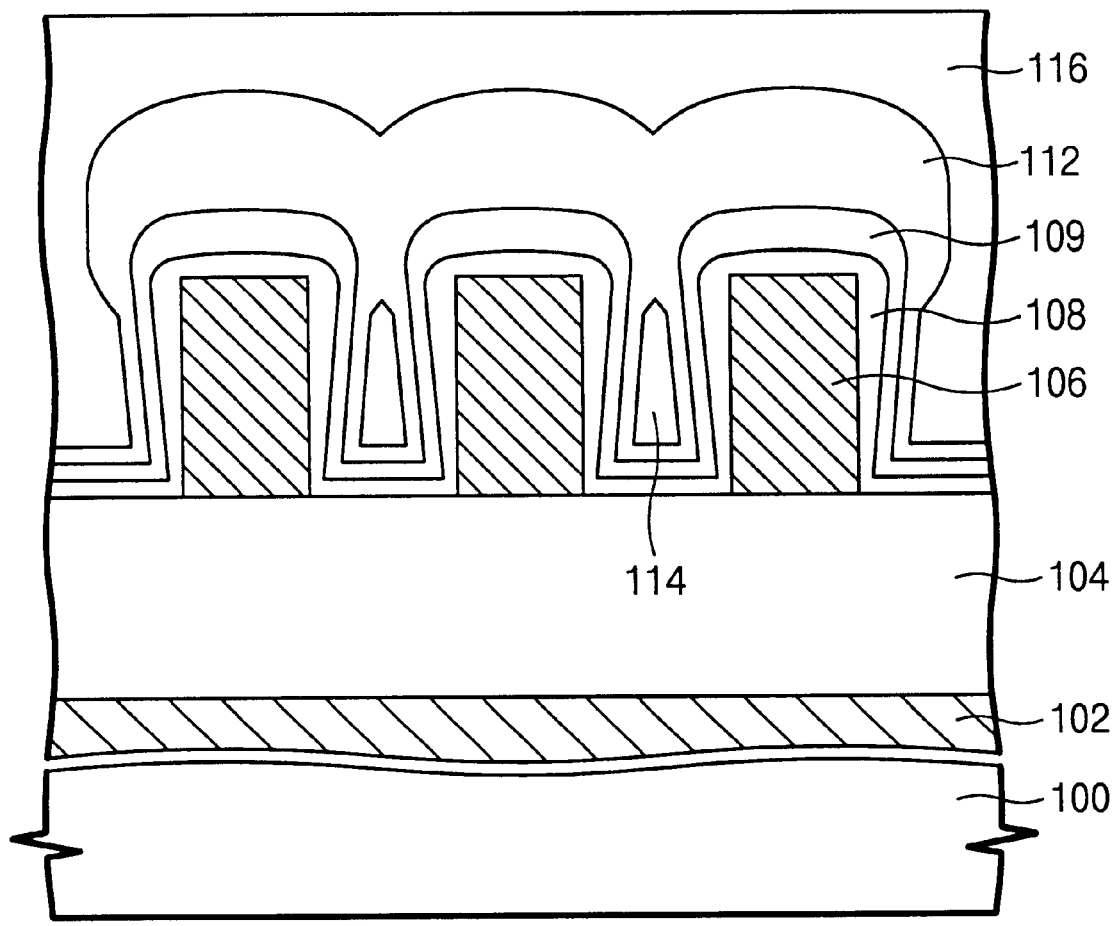
FIG. 5 illustrates a cross-sectional view of a semiconductor substrate having an air gap using a PE-TEOS layer, silicon nitride layer, and silicon oxynitride layer in accordance with another embodiment of the present invention.

FIG. 5 shows a cross-sectional view of a semiconductor topology according to another embodiment of the present invention. In FIG. 5, the same parts functioning as shown in FIGS. 1 to 4 are identified with the same reference numbers and their explanation is omitted for the sake of simplicity and clarity. Referring now to FIG. 5, air gaps, (for example an air gap 114), are formed in the multilayer dielectric layers 108, 109 and 112. More specifically, after forming the PE-TEOS layer 108, a silicon nitride layer 109 is formed to a thickness of about 0.6 microns. After that, the silicon oxynitride layer 112 is formed thickly so as to form the air gap 114, for example, to a thickness of about 1.0 microns.

According to the present invention, the air gaps are formed in the dielectric layer by depositing a plurality of dielectric layers. Silicon oxynitride layer with a dielectric permittivity of about 3.5 is preferentially selected as a second dielectric layer since the silicon oxynitride layer not only forms air gaps therein between the same level metal interconnections, but also reduces coupling capacitance between different level metal interconnections. The first dielectric layer formed on the conductive pattern is deposited such that it provides a poor step coverage, deposited thickly at the top edge portion and deposited thinly at the bottom edge portion of the conductive pattern. The poor step coverage of the first dielectric layer makes it easier to form the air gaps in the second dielectric layer.

It will be recognized by those skilled in the art that the innovative concepts disclosed in the present application can be applied in a wide variety of contexts. Moreover, the preferred implementation can be modified in a tremendous variety of ways. Accordingly, it should be understood that the modification and variations suggested below and above are merely illustrative. These examples may help to show some of the scope of the inventive concepts, but these examples do not nearly exhaust the fall scope of variation in the disclosed novel concepts.

What is claimed is:

1. A process for forming a multilayer dielectric on a semiconductor device, comprising:

providing at least a pair of spaced apart interconnections over a substrate having an interlayer insulating layer at a top thereof;

depositing a first dielectric layer on said spaced apart interconnections and over said substrate, said first dielectric layer being deposited more thickly at top sides of said spaced apart interconnections than at bottom sides of said spaced apart interconnections; and depositing a second dielectric layer over said first dielectric layer, whereby said first dielectric layer completely covers said spaced apart interconnections and said substrate, to form a closed air gap that is completely enclosed in said second dielectric layer between said spaced apart interconnections.

2. The process according to claim 1, wherein a ratio of a height of said spaced apart interconnections, and a distance between said spaced apart interconnections, is about 1.0~1.2 to 0.8~0.9.

3. The process according to claim 1, wherein said second dielectric layer comprises a silicon oxynitride layer (SiON) and has a thickness of about at least 1 micron.

4. The method according to claim 1, wherein said second dielectric layer comprises a silicon nitride layer.

5. The method according to claim 1, further comprising forming a silicon nitride layer over said first dielectric layer before depositing said second dielectric layer.

6. The method according to claim 1, further comprising forming a polyimide layer over said second dielectric layer.

7. A multilayer passivation process for forming air gaps between metal interconnects of a semiconductor device, comprising:

forming first metal patterns over a semiconductor substrate;

forming an intermetal oxide layer over said first metal patterns, said intermetal oxide layer having a thickness of about 0.8 microns;

forming spaced apart metal patterns over said intermetal oxide layer, said spaced apart metal patterns being separated from each other by about 0.8 microns to 0.9 microns, and each having a height of about 1.0 microns to 1.2 microns;

depositing a first passivation layer on said spaced apart metal patterns, said first passivation layer being an oxide and having a thickness of about 0.15 microns;

depositing a second passivation layer over said first passivation layer, whereby said first passivation layer completely covers said spaced apart metal patterns and said intermetal oxide layer, to form a closed air gap of about 0.46 microns in said second passivation layer between said spaced apart metal patterns, said second passivation layer being a silicon oxynitride and having a thickness of about 1.2 microns or more; and depositing a third passivation layer over said second passivation layer, said third passivation layer being a polyimide and having a thickness of about 10 microns.

8. The process according to claim 1, wherein said substrate is an integrated circuit topology.

9. A multilayer passivation process for forming air gaps between metal interconnects of a semiconductor device, comprising:

forming first metal patterns over a semiconductor substrate;

forming an intermetal dielectric layer over said first metal patterns;

forming spaced apart metal patterns over said intermetal dielectric layer;

depositing a first passivation layer on said spaced apart metal patterns;

depositing a second passivation layer over said first passivation layer, whereby said first passivation layer completely covers said spaced apart metal patterns and said intermetal dielectric layer, to form a closed air gap in said second passivation layer between said spaced apart metal patterns; and depositing a third passivation layer over said second passivation layer.

10. The multilayer passivation process according to claim 9, wherein said intermetal dielectric layer and said first passivation layer are oxides, said second passivation layer is a silicon oxynitride and said third passivation layer is a polyimide.

11. A process for forming a multilayer dielectric on a semiconductor device, consisting of:

providing at least a pair of spaced apart interconnections over a substrate having an interlayer insulating layer at a top thereof;

depositing a first dielectric layer on said spaced apart interconnections and over said substrate, said first dielectric layer being deposited more thickly at top sides of said spaced apart interconnections than at bottom sides of said spaced apart interconnections; and depositing a second dielectric layer over said first dielectric layer to form a closed air gap that is completely enclosed in said second dielectric layer between said spaced apart interconnections.

* * * * *